United States Patent
Imai

(10) Patent No.: US 8,723,579 B2
(45) Date of Patent: May 13, 2014

(54) TIMING GENERATION CIRCUIT

(71) Applicant: Seiko Instruments Inc., Chiba (JP)

(72) Inventor: Yasushi Imai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/738,476

(22) Filed: Jan. 10, 2013

(65) Prior Publication Data

US 2013/0182817 A1    Jul. 18, 2013

(30) Foreign Application Priority Data

Jan. 12, 2012    (JP) ................ 2012-004257

(51) Int. Cl.
*H03K 3/00*    (2006.01)
(52) U.S. Cl.
USPC .............. 327/291; 327/295; 327/298; 377/47
(58) Field of Classification Search
USPC ......... 327/105, 107, 172, 176, 291, 293–295, 327/298–299; 377/47–48
See application file for complete search history.

(56) References Cited

U.S. PATENT DOCUMENTS

| | | | |
|---|---|---|---|
| 4,405,982 A | * | 9/1983 | Ruhnau et al. ................. 714/55 |
| 4,443,887 A | * | 4/1984 | Shiramizu ..................... 377/110 |
| 2012/0154649 A1 | * | 6/2012 | Itzhak et al. .................. 348/294 |

FOREIGN PATENT DOCUMENTS

JP    04-246915 A    9/1992

* cited by examiner

*Primary Examiner* — An Luu
(74) *Attorney, Agent, or Firm* — Brinks Gilson & Lione

(57) ABSTRACT

The timing generation circuit includes a binary counter constituted of three T-flip-flop circuits, and a binary state at reset of the binary counter is also used at system reset and in generation of the output pulses, to generate eight output pulses having different timings from eight binary states generated by the binary counter and including the state at the reset. At the system reset, a reset signal to the binary counter is delayed, so that an output of a decoder circuit at the reset of the binary counter is delayed. Therefore, the output of the decoder circuit is masked with a fast reset signal, so that the output of the decoder circuit at the system reset can be prevented from being reflected in an output terminal.

2 Claims, 6 Drawing Sheets

TIMING GENERATION CIRCUIT

RELATED APPLICATIONS

This application claims priority under 35 U.S.C. §119 to Japanese Patent Application No. 2012-004257 filed on Jan. 12, 2012, the entire content of which is hereby incorporated by reference.

BACKGROUND OF THE INVENTION

1. Field of the Invention

The present invention relates to a timing generation circuit, and more particularly, it relates to a timing generation circuit to be mounted on a semiconductor memory device.

2. Description of the Related Art

FIG. 6 is a circuit diagram showing a conventional timing generation circuit.

The timing generation circuit for use in an EEPROM of an IIC interface, or the like has to be reset at all timings. For example, when eight output pulses having different timings are generated, nine binary states including a system reset state are required. Therefore, the timing generation circuit includes a binary counter of four bits in which four T-flip-flop (T-FF) circuits are connected, and a decoder circuit constituted of a logic element of four inputs. The binary counter generates eight binary states. The decoder circuit generates the eight output pulses having different timings from the eight binary states, excluding the binary state at the system reset.

SUMMARY OF THE INVENTION

However, when eight output pulses having different timings are generated, a conventional timing generation circuit requires a binary counter of four bits in which four T-flip-flop circuits are connected, and a decoder circuit which is constituted of a logic element of four inputs.

According to the present invention, there is provided a timing generation circuit which has a small circuit scale, and generates eight output pulses having different timings.

According to the present invention, there is provided a timing generation circuit including a binary counter of three bits in which three T-flip-flop circuits are connected; a decoder circuit which is constituted of a logic element of three inputs; a delay circuit which delays reset of the binary counter; a latch circuit which latches a reset signal; and a 2NOR circuit which masks an output of the decoder circuit at the reset of the binary counter.

A binary state at the reset of the binary counter is also used at system reset and in generation of output pulses, and eight output pulses having different timings are generated from eight binary states generated by the binary counter and including the binary state at the reset. At the system reset, the reset signal to the binary counter is delayed, so that the output of the decoder circuit at the reset of the binary counter is delayed. Therefore, the output of the decoder circuit is masked with a fast reset signal, so that the output of the decoder circuit at the system reset can be prevented from being reflected in an output terminal.

A timing generation circuit of the present invention does not require a binary counter of four bits and a decoder circuit constituted of a logic element of four inputs, but uses a binary counter of three bits, and a decoder constituted of a logic element of three inputs, and hence a circuit scale can be decreased.

DETAILED DESCRIPTION OF THE PREFERRED EMBODIMENTS

Hereinafter, embodiments of the present invention will be described with reference to the drawings.

First Embodiment

Figure 1:
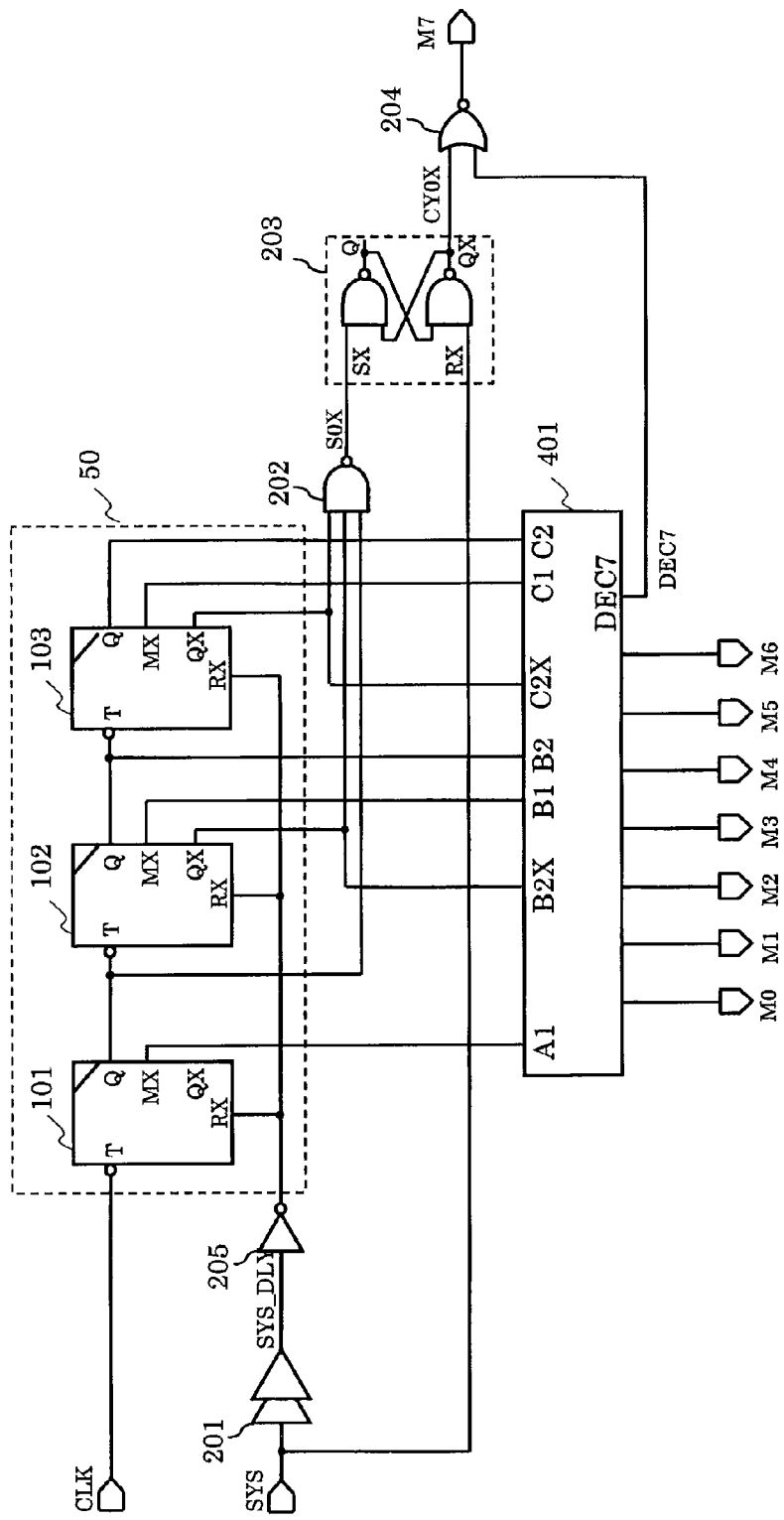
FIG. 1 is a circuit diagram showing a timing generation circuit of a first embodiment.

FIG. 1 is a circuit diagram showing a timing generation circuit of a first embodiment.

The timing generation circuit of the first embodiment includes a binary counter 50 of three bits which is constituted of three T-flip-flop circuits 101 to 103, a delay circuit 201, a 3NAND circuit 202, an RS latch circuit 203, a 2NOR circuit 204, an inverter circuit 205, and a decoder circuit 401.

A clock signal input terminal CLK is connected to an input terminal of the binary counter 50. An input terminal SYS is connected to a reset terminal of the binary counter 50 via the delay circuit 201 and the inverter circuit 205, and connected to a terminal RX of the RS latch circuit 203. The reset terminal of the binary counter 50 is connected to reset terminals RX of the T-flip-flop circuits 101 to 103 in common. Output terminals of the binary counter 50 are connected to the decoder circuit 401 and the 3NAND circuit 202, respectively. An output terminal of the 3NAND circuit 202 is connected to a terminal SX of the RS latch circuit 203. The 2NOR circuit 204 has input terminals which are connected to an output terminal DEC7 of the decoder circuit 401 and an output terminal QX of the RS latch circuit 203, respectively, and an output terminal which is connected to an output terminal M7 of the timing generation circuit. The other seven output terminals of the decoder circuit 401 are connected to output terminals M0 to M6 of the timing generation circuit, respectively.

Figure 2:
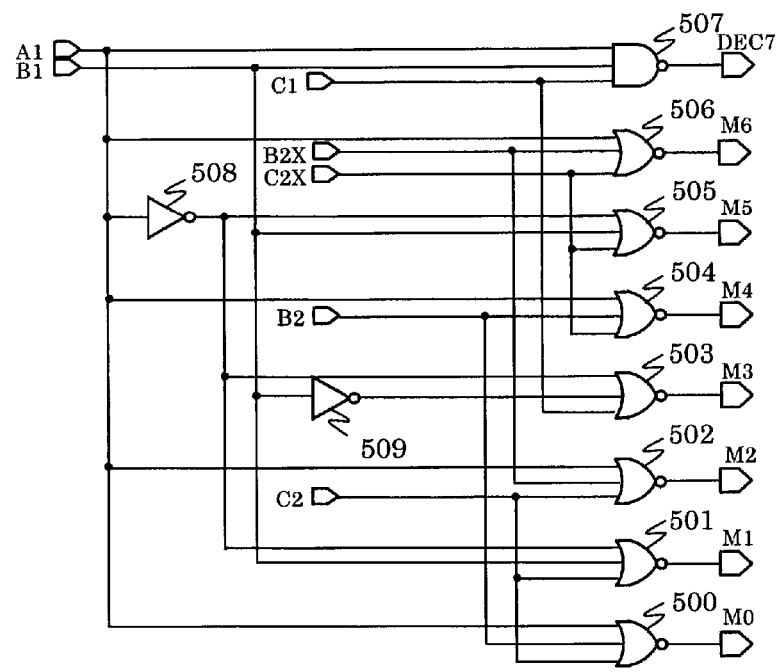
FIG. 2 is a diagram showing a decoder circuit of the present invention.

FIG. 2 is a circuit diagram showing the decoder circuit 401. The decoder circuit 401 includes a 3NAND circuit 507, 3NOR circuits 500 to 506, and inverter circuits 508 and 509.

The T-flip-flop circuit 101 has an output terminal Q which is connected to an input terminal T of the T-flip-flop circuit 102 and an input terminal of the 3NAND circuit 202, and an output terminal MX which is connected to an input terminal A1 of the decoder circuit 401. The T-flip-flop circuit 102 has an output terminal Q which is connected to an input terminal T of the T-flip-flop circuit 103 and an input terminal B2 of the decoder circuit 401; an output terminal QX which is connected to an input terminal B2X of the decoder circuit 401 and an input terminal of the 3NAND circuit 202; and an output terminal MX which is connected to an input terminal B1 of the decoder circuit 401. The T-flip-flop circuit 103 has an output terminal Q which is connected to an input terminal C2 of the decoder circuit 401; an output terminal QX which is connected to an input terminal C2X of the decoder circuit 401 and an input terminal of the 3NAND circuit 202; and an output terminal MX which is connected to an input terminal C1 of the decoder circuit 401.

The decoder circuit 401 has internal connections as follows. The input terminal A1 is connected to input terminals of the 3NAND circuit 507, the 3NOR circuit 506, the inverter circuit 508, the 3NOR circuit 504, the 3NOR circuit 502 and the 3NOR circuit 500. The input terminal B1 is connected to input terminals of the 3NAND circuit 507, the 3NOR circuit 505, the inverter circuit 509 and the 3NOR circuit 501. The input terminal B2 is connected to input terminals of the 3NOR circuit 504 and the 3NOR circuit 500. The input terminal B2X is connected to input terminals of the 3NOR circuit 506 and the 3NOR circuit 502. The input terminal C1 is connected to input terminals of the 3NAND circuit 507 and the 3NOR circuit 503. The input terminal C2 is connected to input terminals of the 3NOR circuits 502, 501 and 500. The input terminal C2X is connected to input terminals of the 3NOR circuits 506, 505 and 504. An output terminal of the inverter circuit 508 is connected to input terminals of the 3NOR circuit 501, the 3NOR circuit 503 and the 3NOR circuit 505. An output terminal of the inverter circuit 509 is connected to an input terminal of the 3NOR circuit 503.

Figure 3:
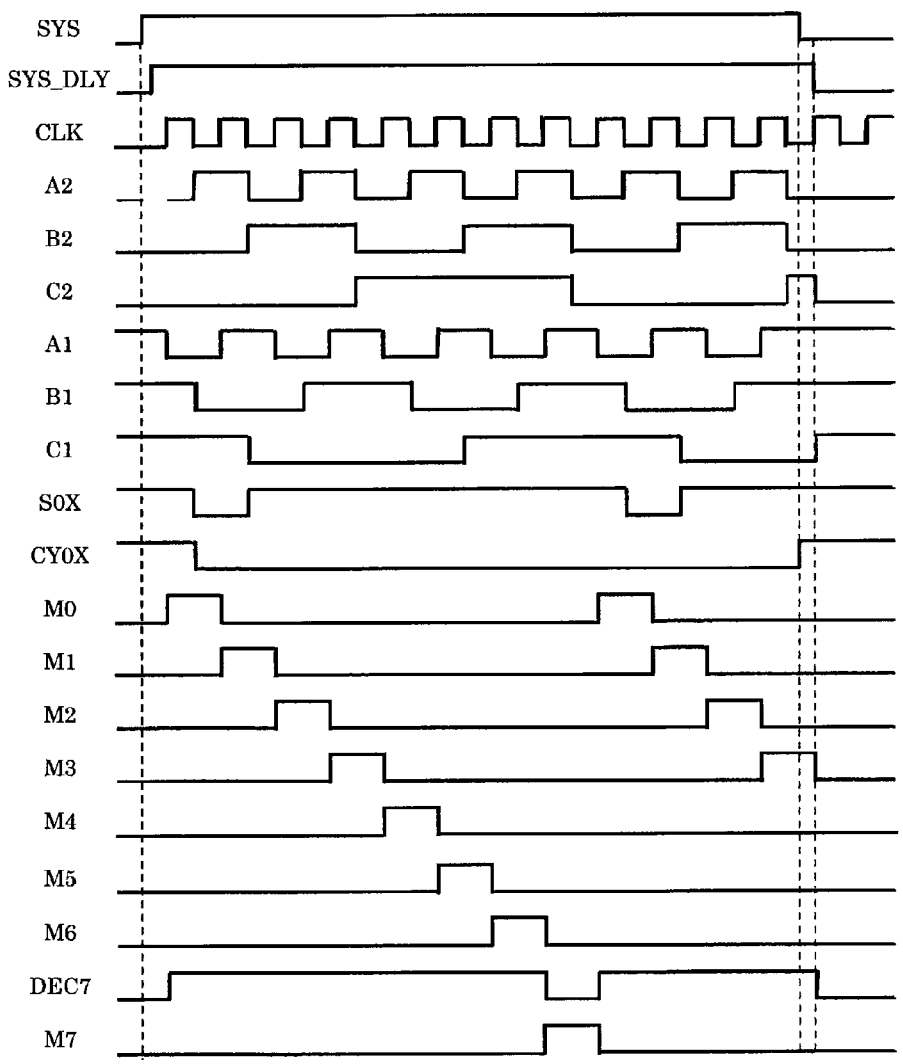
FIG. 3 is a timing chart showing an operation of the timing generation circuit of the first embodiment.

Next, an operation of the timing generation circuit of the first embodiment will be described. FIG. 3 is a timing chart showing the operation of the timing generation circuit of the first embodiment.

A signal SYS becomes a high level at system enabling. When a clock signal CLK is input at the high level of the signal SYS, in accordance with output states of the T-flip-flop circuits 101 to 103, the decoder circuit 401 outputs seven output pulses M0 to M6 having different timings, and a signal DEC7. When an output CY0X of the RS latch circuit 203 is a low level output and the signal DEC7 has a low level, the 2NOR circuit 204 outputs an eighth output pulse M7. Immediately after the signal SYS becomes the high level, the signal DEC7 has the low level, but the signal CY0X has the high level, and hence the output pulse M7 has the low level.

At system reset, the signal SYS becomes the low level. The latch circuit 203 is reset by the signal SYS. The T-flip-flop circuits 101 to 103 are reset by a signal SYS_DLY output from the delay circuit 201. That is, the latch circuit 203 is reset prior to the T-flip-flop circuits 101 to 103. Therefore, the signal CY0X becomes the high level before the signal DEC7 becomes the low level, and hence the output pulse M7 holds the low level.

As described above, the timing generation circuit of the first embodiment includes the binary counter constituted of the three T-flip-flop circuits, and a binary state at reset of the binary counter is also used at the system reset and in the generation of the output pulses. Consequently, from eight binary states generated by the binary counter and including the binary state at the reset, the eight output pulses having different timings can be generated. That is, the three-bit T-flip-flop circuits, the 3NAND circuit, the 3NOR circuit and the decoder circuit generate the eight output pulses M0 to M7 having different timings, and hence a circuit scale can be decreased.

Second Embodiment

In the first embodiment, the binary counter constituted of the three-bit T-flip-flop circuits and the decoder circuit constituted of 3NAND and 3NOR generate the eight output pulses having different timings, but the number of the output pulses which can be generated is not limited to eight. For example, when a D-flip-flop circuit is added to the first embodiment, nine output pulses having different timings can be generated.

Figure 4:
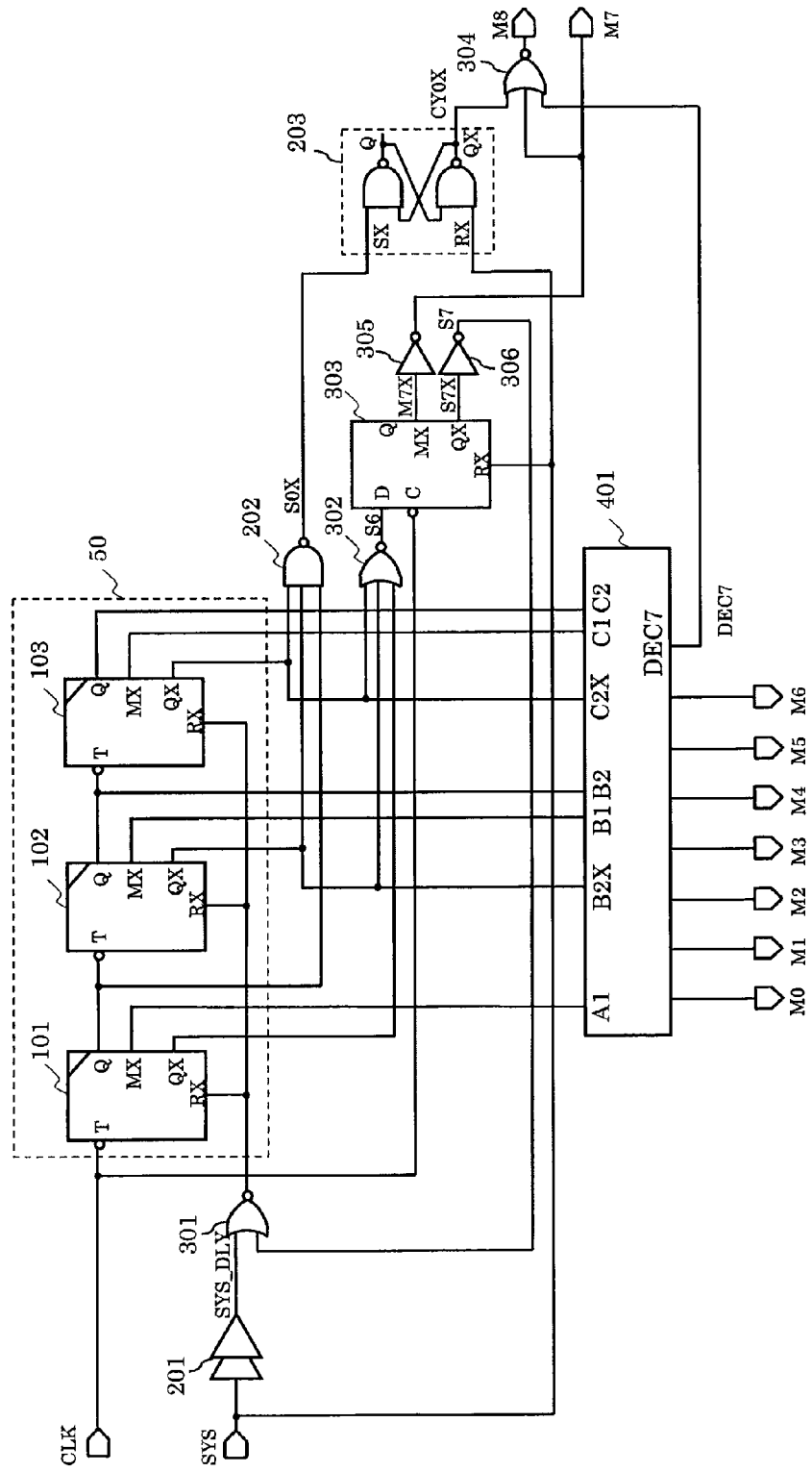
FIG. 4 is a circuit diagram showing a timing generation circuit of a second embodiment.

First, a constitution of a timing generation circuit of a second embodiment will be described. FIG. 4 shows a circuit diagram of the timing generation circuit of the second embodiment.

The timing generation circuit of the second embodiment includes a binary counter 50, a delay circuit 201, a 3NAND circuit 202, an RS latch circuit 203, a 2NOR circuit 301, a 3NOR circuit 302, a D-flip-flop circuit 303, a 3NOR circuit 304, inverter circuits 305 and 306, and a decoder circuit 401.

A clock signal input terminal CLK is connected to a T-flip-flop circuit 101 and the D-flip-flop circuit 303.

The clock signal input terminal CLK is connected to an input terminal of the binary counter 50 and an input terminal C of the D-flip-flop circuit 303. An input terminal SYS is connected to a reset terminal of the binary counter 50 via the delay circuit 201 and the 2NOR circuit 301, and connected to a terminal RX of the RS latch circuit 203 and an input terminal RX of the D-flip-flop circuit 303. Output terminals of the binary counter 50 are connected to the decoder circuit 401, the 3NAND circuit 202 and the 3NOR circuit 302, respectively. An output terminal of the 3NAND circuit 202 is connected to a terminal SX of the RS latch circuit 203. An output terminal of the 3NOR circuit 302 is connected to an input terminal D of the D-flip-flop circuit 303. An output terminal Q of the D-flip-flop circuit 303 is connected to an input terminal of the inverter circuit 305, and an output terminal QX thereof is connected to an input terminal of the inverter circuit 306. An output terminal of the inverter circuit 305 is connected to an output terminal M7 of the timing generation circuit. An output terminal of the inverter circuit 306 is connected to an input terminal of the 2NOR circuit 301. The 3NOR circuit 304 has input terminals which are connected to an output terminal DEC7 of the decoder circuit 401, an output terminal of the inverter circuit 305 and an output terminal QX of the RS latch circuit 203, respectively, and an output terminal which is connected to an output terminal M8 of the timing generation circuit. The other seven output terminals of the decoder circuit 401 are connected to output terminals M0 to M6 of the timing generation circuit, respectively.

The T-flip-flop circuit 101 has an output terminal Q which is connected to an input terminal T of a T-flip-flop circuit 102 and an input terminal of the 3NAND circuit 202; an output terminal QX which is connected to an input terminal of the 3NOR circuit 302; and an output terminal MX which is connected to an input terminal A1 of the decoder circuit 401. The T-flip-flop circuit 102 has an output terminal Q which is connected to an input terminal T of the T-flip-flop circuit 103 and an input terminal B2 of the decoder circuit 401; an output terminal QX which is connected to an input terminal B2X of the decoder circuit 401, an input terminal of the 3NAND circuit 202 and an input terminal of the 3NOR circuit 302; and an output terminal MX which is connected to an input terminal B1 of the decoder circuit 401. The T-flip-flop circuit 103 has an output terminal Q which is connected to an input terminal C2 of the decoder circuit 401; an output terminal QX which is connected to an input terminal C2X of the decoder circuit 401, an input terminal of the 3NAND circuit 202 and an input terminal of the 3NOR circuit 302; and an output terminal MX which is connected to an input terminal C1 of the decoder circuit 401.

The decoder circuit 401 has internal connections similar to those of the first embodiment.

Next, an operation of the timing generation circuit of the second embodiment will be described.

Figure 5:
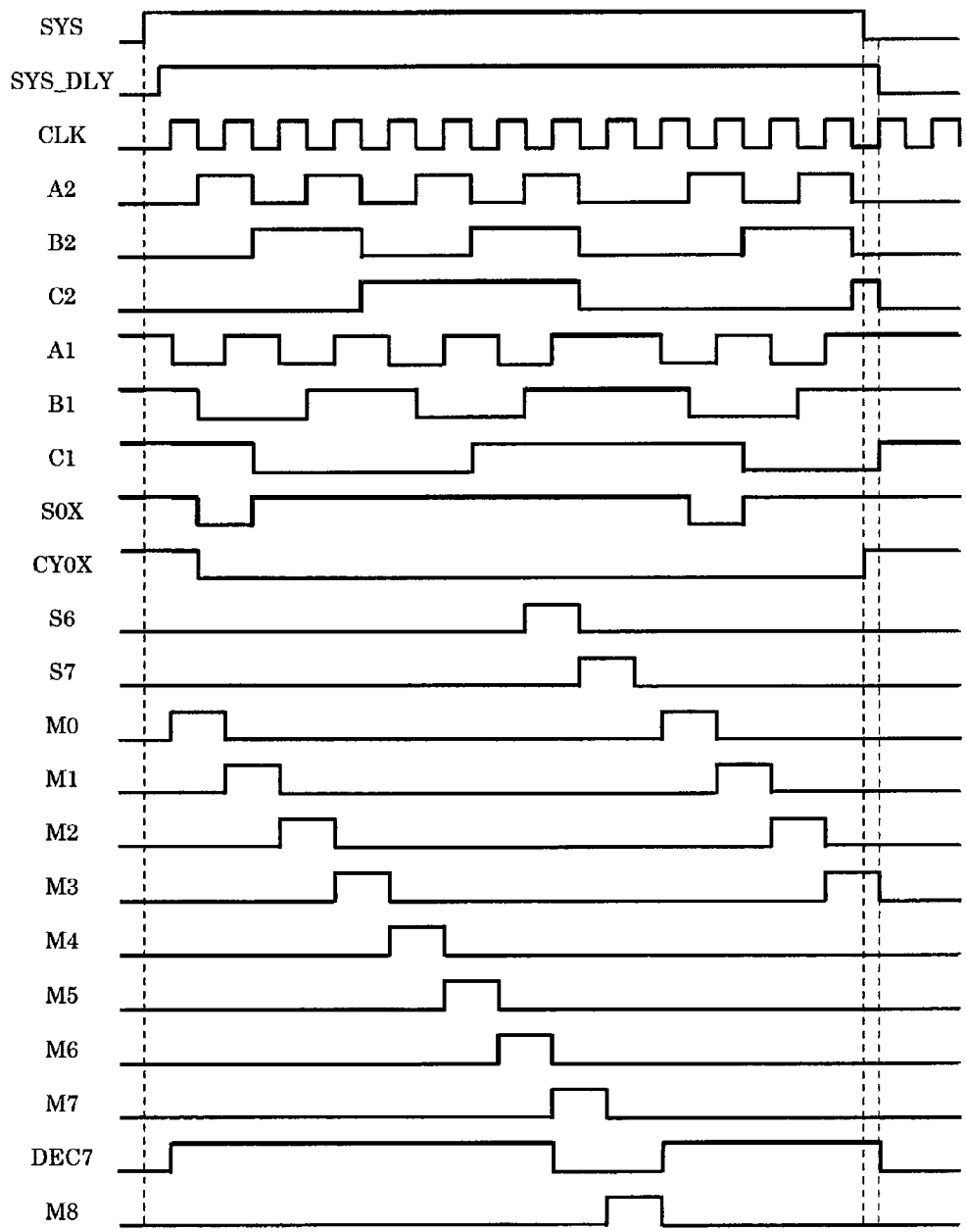
FIG. 5 is a timing chart showing an operation of the timing generation circuit of the second embodiment.
Figure 6:
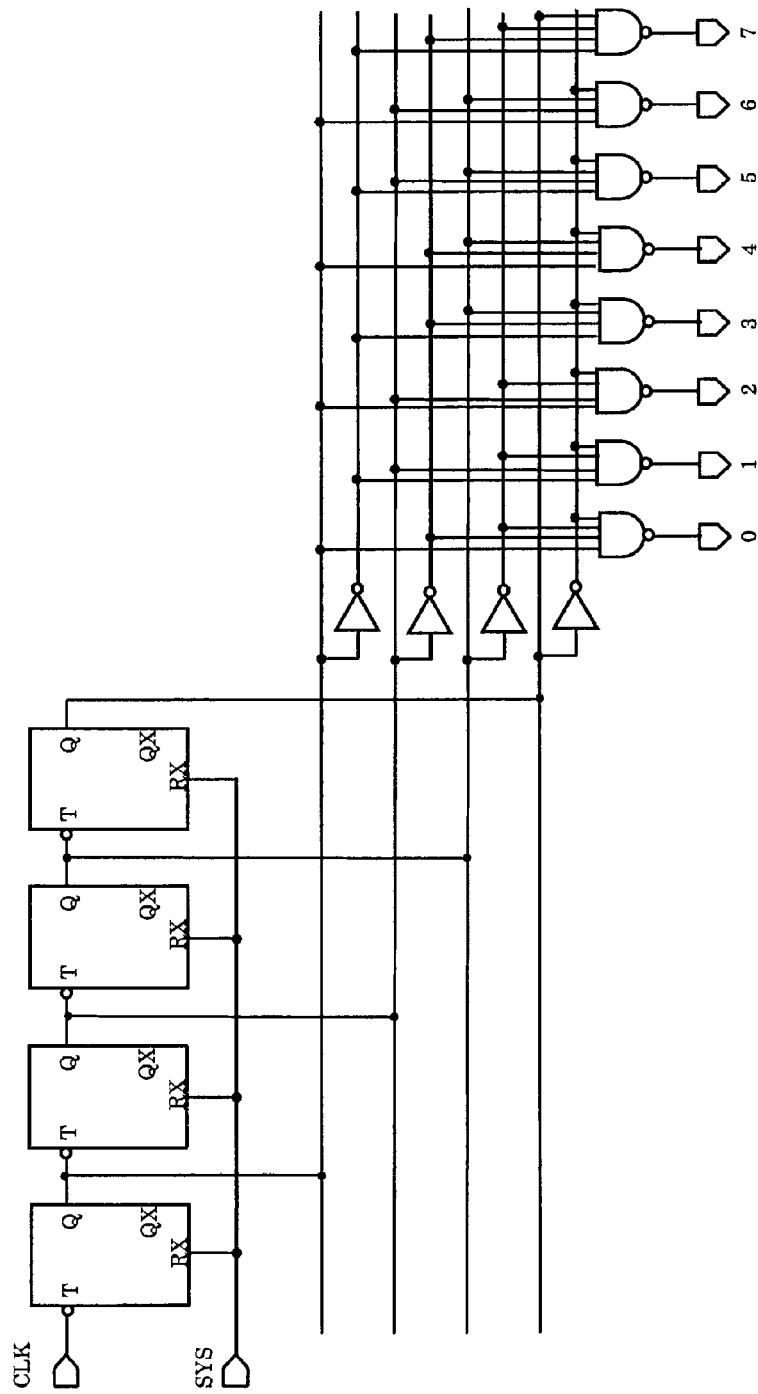
FIG. 6 is a circuit diagram showing a conventional timing generation circuit.

FIG. 5 is a timing chart showing the operation of the timing generation circuit of the second embodiment.

A signal SYS becomes a high level at system enabling. When a clock signal CLK is input at the high level of the signal SYS, in accordance with output states of the T-flip-flop circuits 101 to 103, the decoder circuit 401 outputs seven output pulses M0 to M6 having different timings, and a signal DEC7. The D-flip-flop circuit 303 shifts an output S6 of the 3NOR circuit 302 as much as a half clock, to output an eighth output pulse M7. When an output CY0X of the RS latch circuit 203 and a signal DEC7 are low level outputs, the 3NOR circuit 304 outputs a ninth output pulse M8 at a timing when the output pulse M7 becomes the low level. Immediately after the signal SYS becomes the high level, the signal DEC7 has the low level, but the signal CY0X has the high level, and hence the output pulse M8 has the low level. At system reset, the signal SYS becomes the low level. Immediately after the signal SYS becomes the low level, the delay circuit 201 delays a signal SYS_DLY so that the signal outputs the low level after the signal SYS. Therefore, the latch circuit 203 is reset prior to the T-flip-flop circuits 101 to 103. Consequently, the signal CY0X outputs the high level before the signal DEC7 outputs the low level, and hence the output pulse M8 holds the low level.

As described above, in the timing generation circuit of the second embodiment, the three-bit T-flip-flop circuits, the 3NAND circuit, the two 3NOR circuits, the 2NOR circuit, the D-flip-flop circuit, the two inverter circuits and the decoder circuit generate the nine output pulses M0 to M8 having different timings, and hence a circuit scale can be decreased.

What is claimed is:

1. A timing generation circuit which comprises a binary counter and a decoder circuit, and outputs a pulse signal based on a clock signal and a reset signal,
    the timing generation circuit further comprising:
    a latch circuit directly connected to a system input terminal and having an output connected to a NOR circuit, and latching the reset signal; and
    a delay circuit connected to the system input terminal that delays the reset signal to reset the binary counter, such that the latch circuit is reset prior to the binary counter,
    wherein the binary counter consists of three T-flip-flop circuits, and outputs an 8 bit pulse signal, each pulse having a different timing.

2. The timing generation circuit comprising a binary counter and a decoder circuit, and outputting a pulse signal based on a clock signal and a reset signal,
    the timing generation circuit further comprising:
        a latch circuit that latches the reset signal; and a delay circuit that delays the reset signal to reset the binary counter,
        wherein the binary counter includes three T-flip-flop circuits, and outputs an 8 bit pulse signal; and
        a D-flip-flop circuit that receives an output signal of the binary counter, and outputs a 9 bit pulse signal.

* * * * *

UNITED STATES PATENT AND TRADEMARK OFFICE
CERTIFICATE OF CORRECTION

PATENT NO.        : 8,723,579 B2
APPLICATION NO.   : 13/738476
DATED             : May 13, 2014
INVENTOR(S)       : Yasushi Imai It is certified that error appears in the above-identified patent and that said Letters Patent is hereby corrected as shown below:

In the Claims

In column 6, claim 2, line 15, before "timing generation circuit comprising" replace "The" with --A--.

Signed and Sealed this
Nineteenth Day of August, 2014

Michelle K. Lee
*Deputy Director of the United States Patent and Trademark Office*